United States Patent [19]

Bartolini et al.

[11] 4,121,881
[45] Oct. 24, 1978

[54] DUPLICATING A HOLOGRAPHIC RECORD BY USING TWO REFERENCE BEAMS

[75] Inventors: Robert Alfred Bartolini, Trenton; John Patrick Russell, Pennington, both of N.J.

[73] Assignee: RCA Corporation, New York, N.Y.

[21] Appl. No.: 702,196

[22] Filed: Jul. 2, 1976

[51] Int. Cl.² .............................................. G02B 27/00
[52] U.S. Cl. .................................. 350/3.67; 350/3.69; 350/3.77
[58] Field of Search ........................................ 350/3.5

[56] References Cited

U.S. PATENT DOCUMENTS

| 3,296,594 | 1/1967 | Van Heerden | 350/3.5 UX |
| 3,947,085 | 3/1976 | Mottier | 350/3.5 |
| 4,017,144 | 4/1977 | Staebler | 350/3.5 |

OTHER PUBLICATIONS

Van Heerden, "Theory of Optical Information Storage in Solids," *Applied Optics*, vol. 2, No. 4, Apr. 1963, pp. 393–400.
De et al., "Three-Beam Holography," *Applied Physics Letters*, vol. 10, No. 3, Feb. 1967, pp. 78–79.
Palais et al., "Improving Efficiency of . . . Holograms by Copying," *Applied Optics*, vol. 10, No. 3, Mar. 1971, pp. 667–668.
Guther et al., "Selective Readout . . . in Volume Holography . . .," *Optics Communications*, vol. 13, No. 1, Jan. 1975, pp. 21–24.

*Primary Examiner*—John K. Corbin
*Assistant Examiner*—John D. Lee
*Attorney, Agent, or Firm*—H. Christoffersen; Joseph D. Lazar

[57] ABSTRACT

A primary recording medium simultaneously receives a pair of reference beams, one of which is comprised of rays that are parallel to an axis of rotation of the primary medium. The primary medium is incrementally rotated about the axis after each of a plurality of object beams is transmitted in sequence thereto from a fixedly disposed source. Interactions between the object beams and the reference beams are recorded in the primary medium as volume holograms, whereby a primary record is recorded. Reconstructions of the object beams and corresponding reference beams emanate from the primary record in response to a primary reconstructing beam. An interaction between the reconstructions is recorded as a volume hologram in a secondary recording medium whereby a secondary record is recorded. A reconstruction of a selected one of the object beams emanates from the secondary record in response to a secondary reconstructing beam.

5 Claims, 7 Drawing Figures

DUPLICATING A HOLOGRAPHIC RECORD BY USING TWO REFERENCE BEAMS

BACKGROUND OF THE INVENTION

1. Field of Invention

This invention relates to holography, and more particularly to volume holography.

2. Description of the Prior Art

A hologram is a diffraction grating having bars corresponding to fringes of an interference pattern typically formed by an interaction of two coherent beams of light of a given wavelength, referred to as an object beam and a reference beam, respectively. The wavefront of the object beam is usually amplitude modulated by an object, such as a photographic transparency. The diffraction grating is a photograph of the interference pattern and is referred to as a holographic record of the transparency.

In a volume hologram, the beams interact within a recording medium at a depth that is much greater than spacing between adjacent fringes, thereby causing the depth within the medium of the diffraction grating to be much greater than the spacing between adjacent bars.

The medium typically has the shape of a rectangular parallelpiped whereby the medium has flat surfaces. Two of the surfaces that are opposite from each other are referred to as a recording surface and a read-out surface, respectively. During the recording of the volume hologram, the beams are transmitted to the recording surface. After the volume hologram is recorded, a reconstruction of the object beam emanates from the read-out surface in response to a reconstructing beam being transmitted to the recording surface. Well known optical apparatus is used to provide an image that corresponds to modulation of the reconstruction.

Unlike other types of holograms, the reconstruction emanates from the volume hologram only when the reconstructing beam is transmitted to the recording surface substantially over the path of transmission of the reference beam during the recording of the volume hologram. Additionally, the reconstruction and a normal to the read-out surface form an angle that is equal to the angle of incidence of the object beam to the recording surface during the recording of the volume hologram. It should be understood that the reconstructing beam is comprised of coherent light of the given wavelength.

When the reconstructing beam is transmitted to the recording surface over the path of transmission of the reference beam, a condition, known as the Bragg condition, is said to be satisfied. Therefore, the reconstruction emanates from the volume hologram only when the Bragg condition is satisfied. Because of the Bragg condition, the medium may be used for recording a multiplicity of volume holograms as explained hereinafter.

In recording a book, for example, the recording surface is initially exposed to cause a recording in the medium of a volume hologram of a photographic transparency of the first page of the book. After the recording of the first page, the medium is incrementally rotated (through an angle of 1°, for example) with respect to the reference and the object beams. Thereafter, the recording surface is exposed to cause a recording of a volume hologram of a photographic transparency of the second page of the book and the medium is again incrementally rotated. By alternately recording and incrementally rotating, as many as 180 photographic transparencies of pages of the book can be recorded in the medium to comprise a record of the book.

Since the recording of the photographic transparencies of the book may include 180 exposures and 179 rotations of the medium, the record is expensive. Additionally there is no known inexpensive method for providing a duplicate of the record.

SUMMARY OF THE INVENTION

According to a first aspect of the present invention, a replicating reference beam of light is transmitted along a replicating path to a primary recording medium. Additionally, first object and first recording reference beams of light are transmitted at first object and first reference angles of incidence, respectively, to the primary medium. The replicating and first recording reference beams and the first object beam interact to form an interference pattern whereby a first volume hologram is recorded. After the recording of the first hologram, second object and second recording reference beams of light are transmitted at second object and second reference angles of incidence, respectively, to the primary medium. The replicating and second recording reference beams and the second object beam interact to form an interference pattern whereby a second volume hologram is recorded and the medium comprises a primary record. Reconstructions of the object and recording reference beams emanate from the primary record in response to a beam of light that is transmitted to the primary record along the replicating path.

According to a second aspect of the present invention, the reconstructions are transmitted along respective optical paths of equal length to a secondary recording medium where they interact to form an interference pattern that is recorded. Alternatively, the reconstructions and a new replicating reference beam may be transmitted to the secondary medium to interact to form an interference pattern that is recorded, the reconstructions being transmitted along the optical paths of equal length.

DESCRIPTION OF THE PREFERRED EMBODIMENT

A secondary holographic record of a plurality of objects is recorded in response to a single exposure of a recording medium to beams that simultaneously emanate from a primary record. An image corresponding to a selected one of the objects may be produced from the secondary record in response to a transmission thereto of a reconstructing beam. Additionally, a duplicate of the primary record is recorded by exposing the recording medium to the beams that emanate from the primary record and to a reference beam. The records are recorded in a manner explained hereinafter.

Figure 1:
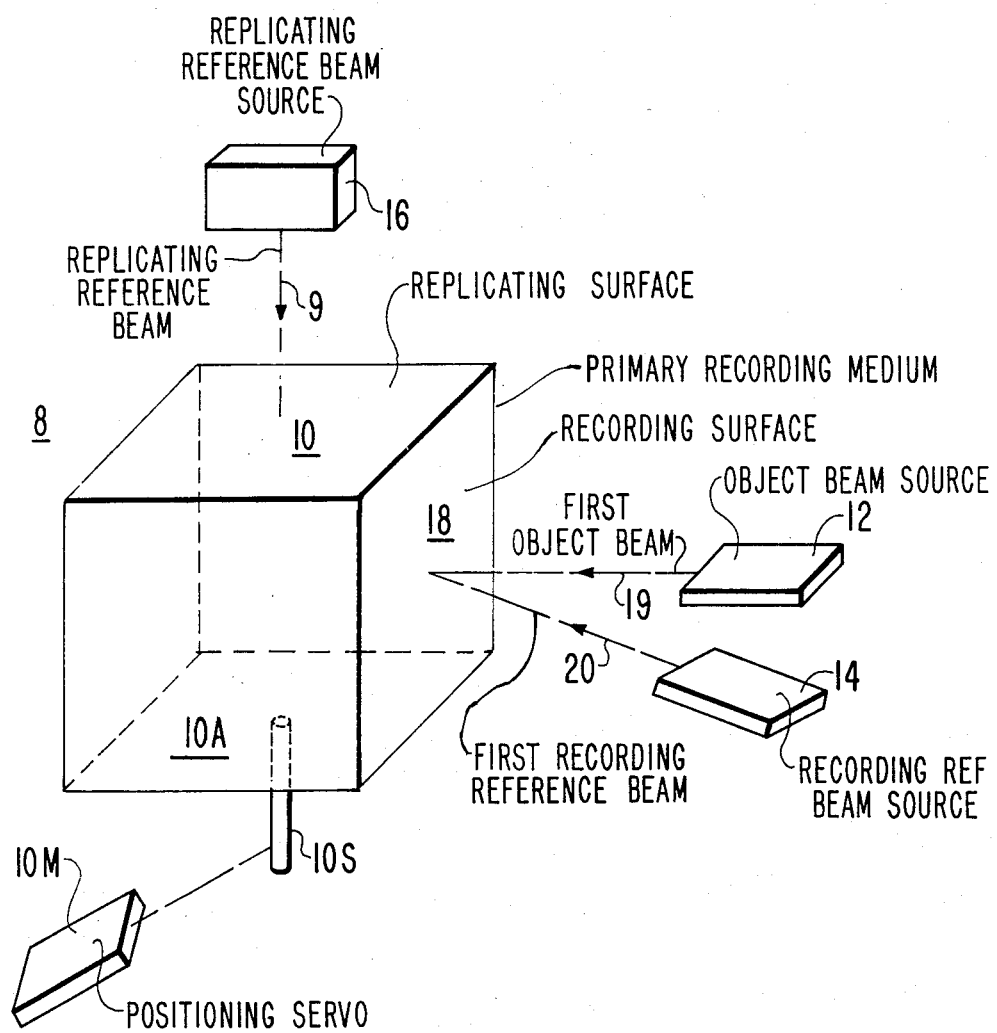
FIG. 1 is a perspective view of apparatus for recording a primary record in accordance with a preferred embodiment of the present invention.

Referring to FIG. 1, a primary recording medium 8 has the general shape of a rectangular parallelpiped. In order to set forth the teachings of the invention in a simplified manner, the medium 8 is represented as having an axis 9 that perpendicularly intersects the center of a replicating surface 10 of the medium 8. Additionally, a surface 10A of the medium 8 is connected to a shaft 10S that is coaxial with the axis 9. The shaft 10S is coupled to a positioning servo 10M that is operable to axially rotate the shaft 10S and thereby rotate the medium 8 about the axis 9.

The medium 8 is rotatable relative to an object source 12 and a recording reference source 14, both of which are fixedly mounted in any suitable manner. The sources 12, 14 transmit a first object beam of light 19 and a first recording reference beam of light 20, respectively, to a recording surface 18 of the medium 8. Additionally, a replicating reference beam source 16 transmits a replicating reference beam of light to the surface 10, rays of the replicating reference beams are substantially parallel to the axis 9. It should be understood that the sources 12, 14, 16 transmit mutually coherent light of a given wavelength.

The first object beam 19 has a wavefront that is amplitude modulated to provide a representation of a first object. Additionally, the rays of the beams 19, 20 are parallel to the surface 10 for reasons explained hereinafter. However, in an alternative embodiment, object and recording reference beams are not parallel to the surface 10.

During a first exposure of the medium 8, the beams 19, 20 are at a first object angle of incidence and a first reference angle of incidence, respectively, to the surface 18. The beams 19, 20 and the replicating reference beam interact to form an interference pattern in the medium 8 that is recorded, whereby a first volume hologram is recorded. After the recording of the first hologram, the servo 10M causes an increment of rotation of the medium 8 about the axis 9.

Figure 2:
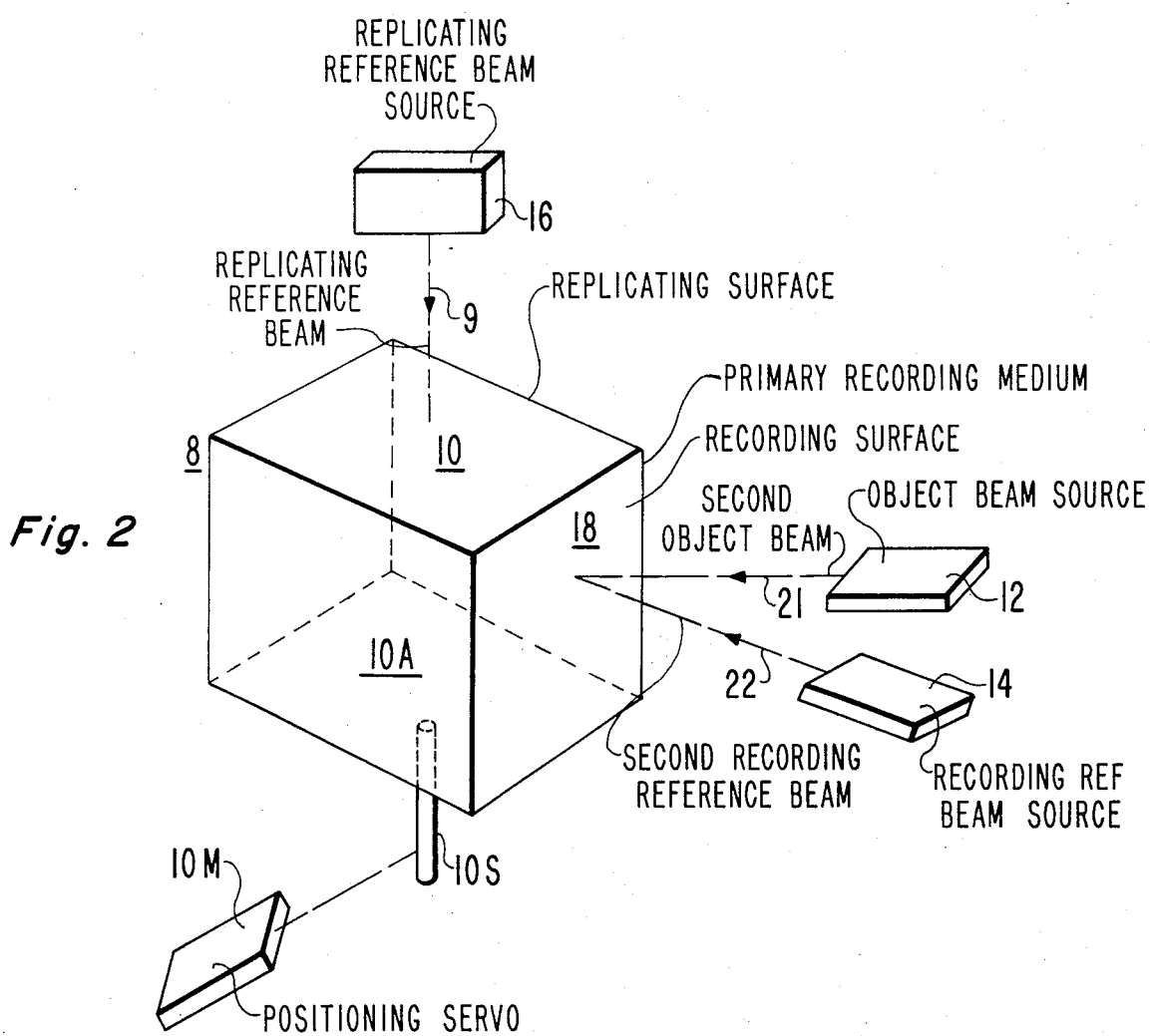
FIG. 2 is a perspective view of the apparatus of FIG. 1 after an incremental rotation of a recording medium.

Referring to FIG. 2, the object source 12 transmits a second object beam 21 having a wavefront that is amplitude modulated to provide representation of a second object. Because of the increment of rotation, the second object beam 21 is at a second object angle of incidence to the surface 18. Since the increment of rotation is about the axis 9, the second object beam 21 is comprised of rays that are substantially parallel to the surface 10.

The increment of rotation additionally causes the recording reference source 14 to transmit a second recording reference beam 22 at a second reference angle of incidence to the surface 18. It should be understood that the second recording reference beam 22 (like the second object beam 21) is comprised of rays parallel to the surface 10. In a second exposure of the medium 8, the beams 21, 22 and the replicating reference beam interact to form an interference pattern in the medium 8 that is recorded, whereby a second volume hologram is recorded in sequence with the first hologram.

When the first and second holograms are recorded, the medium 8 comprises a primary record. The primary record may be of more than two holograms sequentially recorded in a manner similar to the recording of the first and second holograms.

The invention is predicated upon the first and second holograms being sequentially recorded, thereby preventing the primary record from having portions that result from an interaction of either of the beams 19, 20 with either of the beams 21, 22. In other words, the primary record is a diffraction grating that may be represented by a fourier series of spatial frequency components without cross-product terms that result from the interaction of either of the beams 19, 20 with either of the beams 21, 22. Because the first and second holograms are sequentially recorded, a secondary record may be recorded with characteristics similar to the record of the book described hereinbefore.

Since the replicating reference beam is transmitted (to the surface 10) parallel to the axis 9 during the recording of the primary record, Bragg conditions for the first and second holograms are satisfied by a primary reconstructing beam of coherent light at the given wavelength that is transmitted to the surface 10 parallel to the axis 9.

Figure 3:
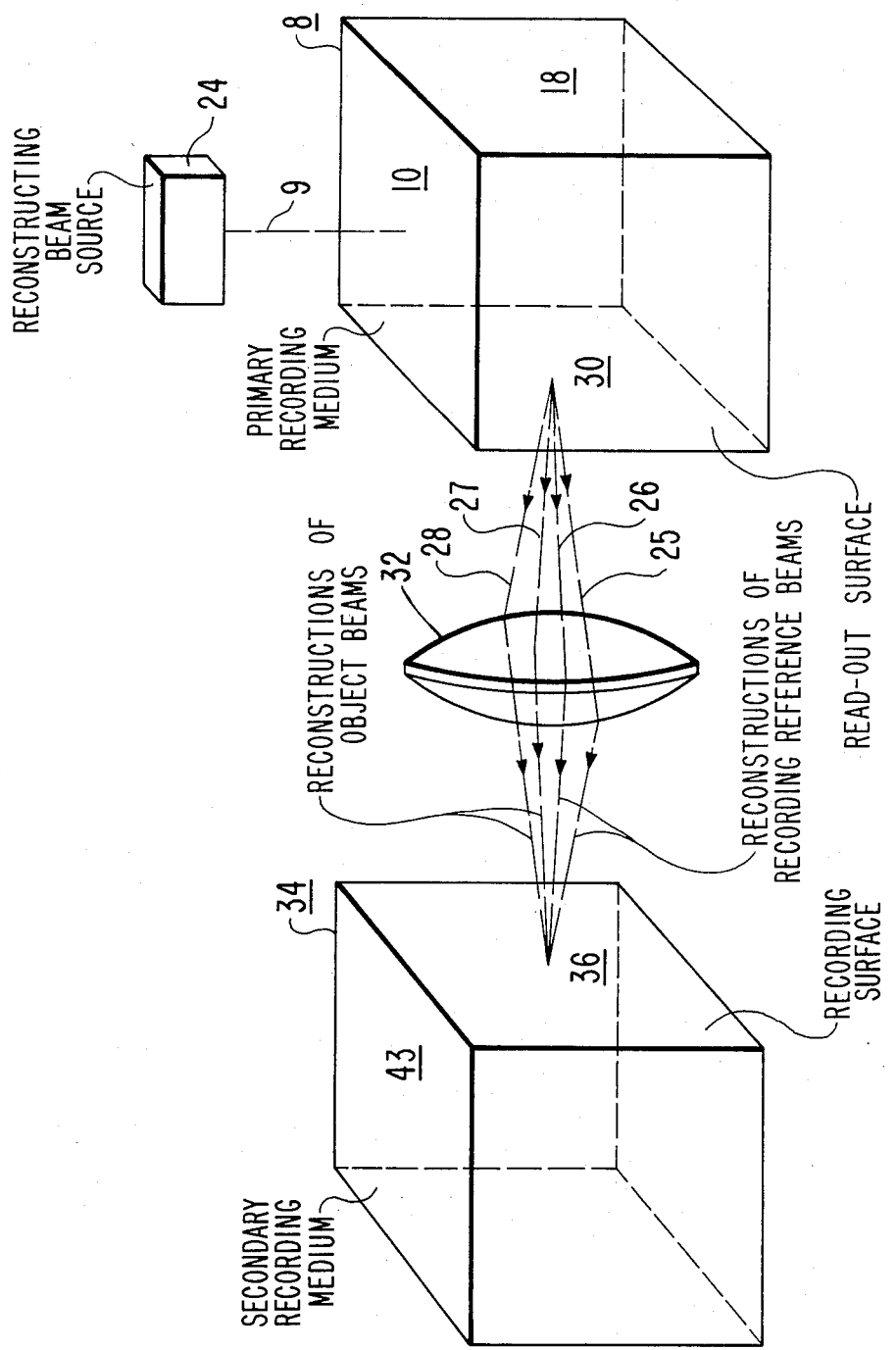
FIG. 3 is a perspective view of apparatus for recording a secondary record of the reconstructions of object and reference beams that emanate from the primary record.

Referring to FIG. 3 the primary reconstructing beam is transmitted from a reconstructing beam source 24, of any suitable type, to the surface 10. In response to the primary reconstructing beam, reconstructions 25, 26, 27, 28 of the first and second recording reference beams and the first and second object beams, respectively, emanate from a read-out surface 30, opposite the surface 18, of the primary record. The reconstructions 25–28 form angles with a normal to the surface 30 equal to the first and second reference angles and the first and second object angles, respectively. Therefore, the reconstructions 25–28 diverge when they emanate from the surface 30.

A lens 32 with convex spherical surfaces is fixedly disposed between the primary record and a secondary recording medium 34 (similar to the medium 8) with a recording surface 36 that is parallel to the surface 30. The surfaces 30, 36 are in object and image planes, respectively, of the lens 32, whereby the lens 32 redirects the reconstructions 25–28 to the surface 36. Therefore, the reconstructions 25–28 are transmitted along respective optical paths that include a glass medium (the lens 32) disposed in an atmospheric medium.

The velocity of the reconstructions 25–28 within the lens 32 is less than the velocity of light in the atmosphere because the index of refraction of glass is greater than the index of refraction of the atmosphere. Therefore, the lens 32 is said to increase the lengths of the optical paths. Since the lens 32 has convex spherical surfaces, the velocity of light through the lens 32 is inversely related to its distance from the center of the lens 32. Because the reconstructions 25–28 diverge, the lens 32 unequally lengthens the optical paths. Although the optical paths are unequally lengthened, the divergence of the reconstructions 25–28 causes the lengths of the optical paths to be equal. Therefore, the relative phases of the reconstructions 25–28 emanating from the surface 30 are substantially the same as the relative phases of the reconstructions 25–28 at the surface 36. The use of the lens 32 to equalize the lengths of the optical paths is in accordance with practices well known in the art.

The reconstructions 25–28 interact within the medium 34 to form an interference pattern whereby the medium 34 is exposed and a secondary record is recorded. Because of the relative phases of the reconstructions 25–28, the secondary record may be represented by a fourier series that does not have cross-product terms corresponding to the cross-product terms referred to hereinbefore. In other words, the secondary record does not have portions that are representative of an interaction of either of the reconstructions 25, 27 (of the beams 19, 20) with either of the reconstructions 26, 28 (of the beams 21, 22). Therefore, the secondary record is similar to one that is produced by sequentially recording interference patterns. Accordingly, the secondary record has characteristics similar to the record of the book.

Figure 4:
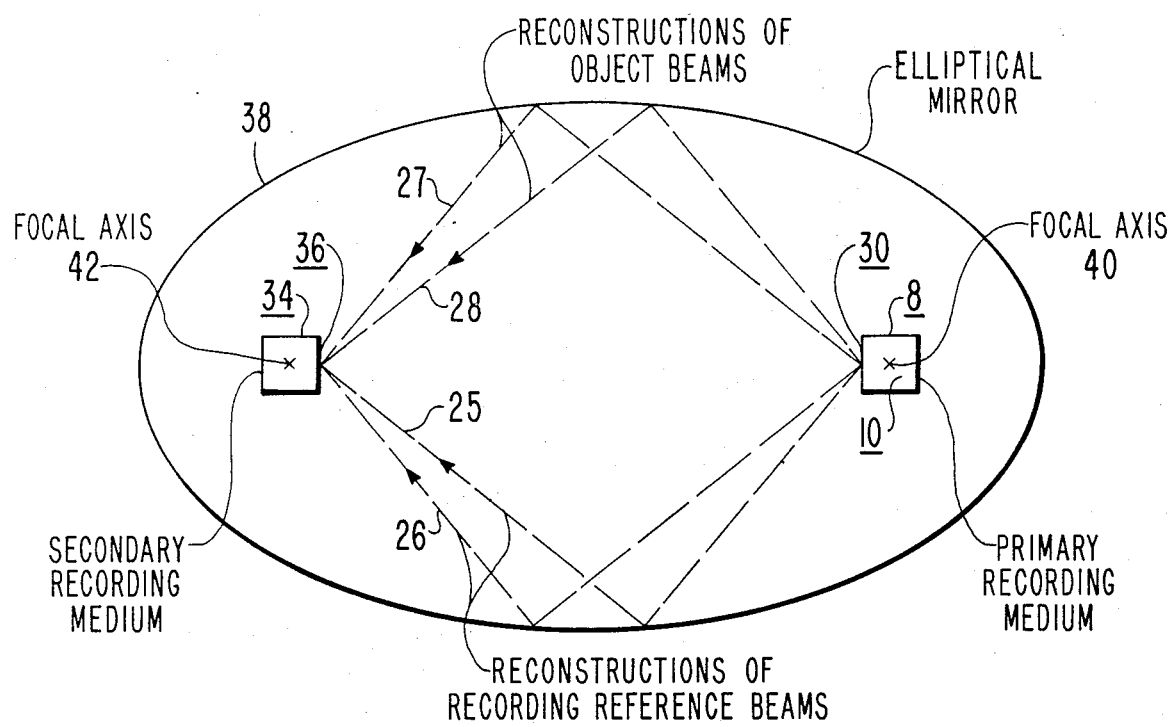
FIG. 4 is a plan view of apparatus which may be used alternatively to the apparatus of FIG. 3.

Referring to FIG. 4 the secondary record may alternatively be recorded by disposing the primary record and the medium 34 within an elliptical mirror 38 at corresponding locations along focal axes 40, 42, respectively, of the mirror 38. (The mirror 38 is substituted for the lens 32 in FIG. 3.) Additionally, the surfaces 30, 36 are parallel to each other and the primary reconstructing beam is transmitted by the source 24 (FIG. 3) as described hereinbefore.

Since the primary record is recorded with the object beams 19, 21 and the recording reference beams 20, 22 parallel to the surface 10, the reconstructions 25–28 emanate from the surface 30 parallel to the surface 10. Inherent properties of an ellipse cause the reconstructions 25–28 to be reflected from the mirror 38 to the surface 36 along optical paths of equal lengths. The reconstructions 25–28 interact within the medium 34 as described hereinbefore.

The relative phases of the reconstructions 25–28 cause the secondary record to have two Bragg conditions; one is satisfied by a secondary reconstructing beam of coherent light at the given wavelength that is transmitted to the surface 36 over the path of the reconstruction 25; the other is satisfied by the secondary reconstructing beam being transmitted to the surface 36 over the path of the reconstruction 26.

Figure 5:
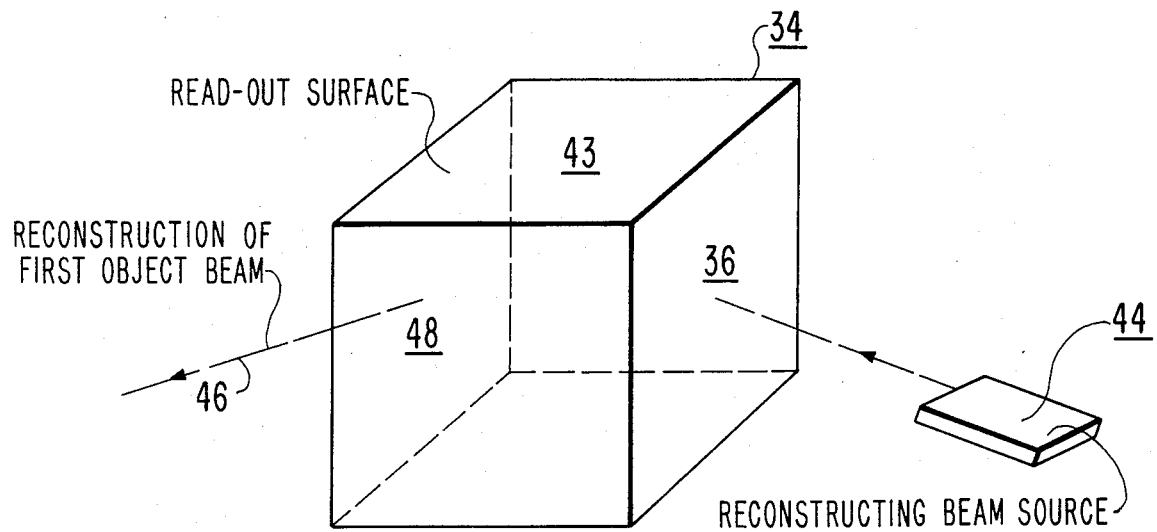
FIG. 5 is a perspective view of apparatus for providing a reconstruction of an object beam from the secondary record.

Since the reconstructions 25, 26 emanate parallel to the surface 10, they are correspondingly parallel to a surface 43 (FIG. 3) of the medium 34. Referring to FIG. 5, a secondary reconstruction beam is transmitted to the surface 36, over the path of the reconstruction 25, by a reconstruction beam source 44 similar to the source 24 described hereinbefore. In response thereto, a reconstruction 46 of the first object beam 19 emanates from a read-out surface 48 of the secondary record; the surfaces 36, 48 are opposite each other.

Figure 6:
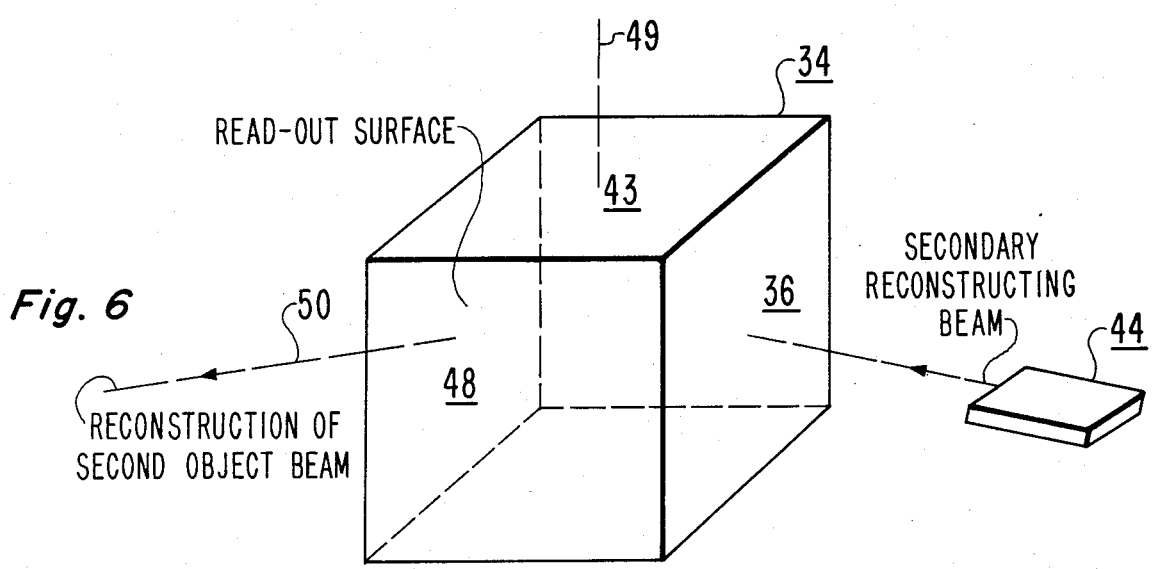
FIG. 6 is a perspective view of the apparatus of FIG. 5 after an incremental rotation of a source of a reference beam.

Referring to FIG. 6, the secondary record has an axis 49 that perpendicularly intersects the center of the surface 43. Since the reconstructions 25, 26 are parallel to the surface 43, the source 44 is incrementally rotated about the axis 49 to cause the secondary reconstructing beam to be transmitted to the surface 36 over the path of the reconstruction 26. In response thereto, a reconstruction 50 of the second object beam 21 emanates from the surface 48. It should be understood that well known optical apparatus may be used to image either of the reconstructions 46, 50 upon a screen and thereby provide to an observer a view of an image corresponding to either the first or the second object.

Figure 7:
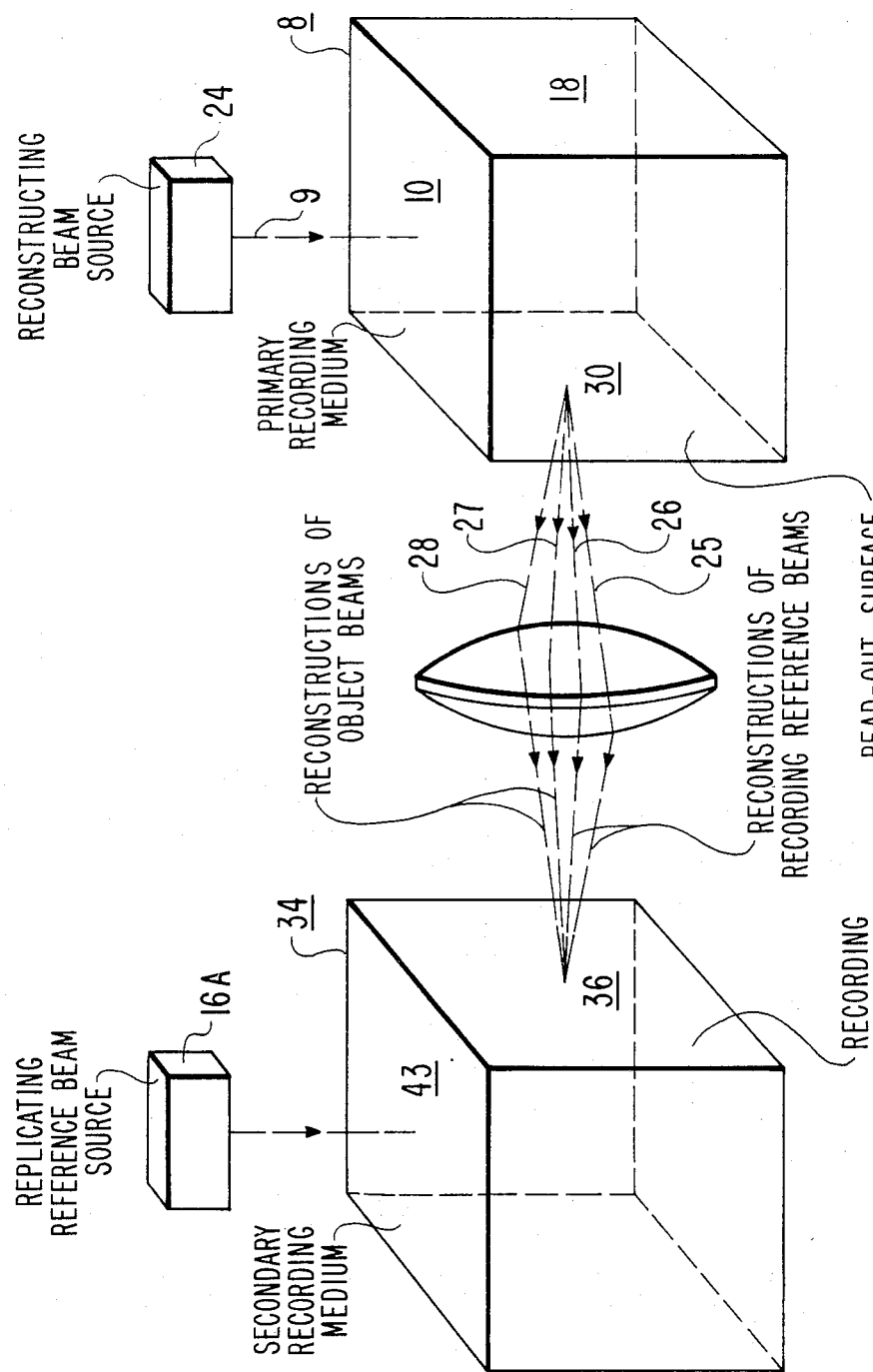
FIG. 7 is a perspective view of apparatus for duplicating the primary record of FIG. 1.

Referring to FIG. 7, a recording of a duplicate of the primary record differs from the recording of the secondary record in that a replicating reference beam of coherent light of the given wavelength (similar to the replicating reference beam described in connection with FIG. 1 and FIG. 2) is transmitted from a replicating reference source 16A to the surface 43; rays of the replicating reference beams are substantially perpendicular to the surface 43. The reconstructions 25–28 and the replicating reference beam interact to form an interference pattern whereby the medium 34 is exposed. Because of the relative phases of the reconstructions 25–28, a recording of the interference pattern formed by the replicating reference beam and the reconstructions 25–28 is substantially a duplicate of the primary record.

What is claimed is:

1. In a method of holographically recording interference patterns formed by beams of light that are mutually coherent and of a given wavelength, the steps of:
   transmitting a replicating reference beam to a replicating surface of a primary recording medium at a fixed angle of incidence therewith;
   concurrently transmitting a first object beam and a recording reference beam at first object and first reference angles of incidence, respectively, to said primary medium, both of which beams interact therein with said replicating reference beam to form an interference pattern that is recorded as a first volume hologram; and
   concurrently transmitting a second object beam and said recording reference beam at second object and second reference angles of incidence, respectively, to said primary medium, said first and second reference angles differing from each other, said second object, recording reference and replicating reference beams interacting within said primary medium to form an interference pattern that is recorded as a second volume hologram, a primary record being formed by said primary medium after the recording of said first and second holograms.

2. The method of claim 1 wherein said primary medium has the shape of a parallelpiped and said object and recording reference beams are transmitted parallel to said replicating surface.

3. The method of claim 1 including the additional steps of:
   transmitting a reconstructing beam of coherent light of said given wavelength to said replicating surface of said primary record at said fixed angle of incidence, thereby causing reconstructions of said object and recording reference beams to emanate therefrom; and
   redirecting and reconstructions along respective optical paths of equal length to a secondary recording medium, beams within said secondary medium interacting to form an interference pattern.

4. The method of claim 3 including the additional step of transmitting a replicating reference beam to said secondary medium to interact therein with said reconstructions, whereby a record of said interference pattern is substantially a duplicate of said primary record.

5. A holographic recording of interference patterns formed by beams of light that are mutually coherent and of a given wavelength made by the steps of;
   transmitting a first object beam and a first reference beam at first object and first reference angles of incidence, respectively, to a primary recording medium;
   transmitting a replicating reference beam along a replicating path to a replicating surface of said primary medium wherein said first object, first reference and replicating reference beams interact to form an interference pattern that is recorded as a first volume hologram;

transmitting a second object beam and a second reference recording beam at second object and second reference angles of incidence, respectively, to said primary medium, both of which interact therein with said replicating reference beam to form an interference pattern that is recorded as a second volume hologram, a primary record being formed by said primary medium after the recording of said first and second holograms;

transmitting a reconstructing beam of coherent light of said given wavelength along said replicating path to said primary record thereby causing reconstructions of said object and recording reference beams to emanate therefrom;

redirecting said reconstructions along respective optical paths of equal length to a secondary recording medium, beams within said secondary medium interacting to form an interference pattern; and transmitting a replicating reference beam to said secondary medium to interact therein with said reconstructions whereby a record of said interference pattern is substantially a duplicate of said primary record.

* * * * *